(12) United States Patent
Li et al.

(10) Patent No.: US 7,316,844 B2
(45) Date of Patent: Jan. 8, 2008

(54) SPIN-ON PROTECTIVE COATINGS FOR WET-ETCH PROCESSING OF MICROELECTRONIC SUBSTRATES

(75) Inventors: Chenghong Li, Morrisville, NC (US); Kimberly A. Ruben, St. James, MO (US); Tony D. Flaim, St. James, MO (US)

(73) Assignee: Brewer Science Inc., Rolla, MO (US)

( * ) Notice: Subject to any disclaimer, the term of this patent is extended or adjusted under 35 U.S.C. 154(b) by 319 days.

(21) Appl. No.: 10/759,448

(22) Filed: Jan. 16, 2004

(65) Prior Publication Data

US 2005/0158538 A1   Jul. 21, 2005

(51) Int. Cl.
*B32B 27/08* (2006.01)
*B32B 15/08* (2006.01)
*B32B 17/10* (2006.01)

(52) U.S. Cl. .............. 428/421; 428/422; 428/426; 428/429; 428/447; 428/457; 428/522

(58) Field of Classification Search ............ 428/421
See application file for complete search history.

(56) References Cited

U.S. PATENT DOCUMENTS

| | | | | |
|---|---|---|---|---|
| 3,398,044 | A * | 8/1968 | Plueddemann | 442/293 |
| 3,461,027 | A * | 8/1969 | Plueddemann | 442/108 |
| 3,468,834 | A * | 9/1969 | Oda | 524/364 |
| 3,585,103 | A * | 6/1971 | Brent | 442/103 |
| 3,826,709 | A * | 7/1974 | Humphries | 428/469 |
| 4,800,125 | A * | 1/1989 | Plueddemann | 428/405 |
| 5,217,568 | A | 6/1993 | Tessier et al. | |
| 5,353,705 | A * | 10/1994 | Lewis et al. | 101/453 |
| 5,585,450 | A | 12/1996 | Oaks et al. | |
| 5,753,523 | A | 5/1998 | Giedd et al. | |
| 5,874,365 | A | 2/1999 | Tomita et al. | |
| 2002/0185199 | A1* | 12/2002 | Myers et al. | 148/537 |

FOREIGN PATENT DOCUMENTS

EP   0 539 973   5/1993

OTHER PUBLICATIONS

Bishop, David, Arthur Heuer, and David Williams, *Microelectromechanical Systems: Technology and Applications*, MRS Bulletin, Apr. 2001, pp. 282-288.

Bodas, Dhananjay, Sheethal J. Patil, V.N. Krishnamurthy, and S.A. Gangal, "PMMA as an etch mask for silicon micromachining-a feasibility study", *J. Indian Inst. Sci.*, vol. 81, Dec. 2001, pp. 645-651.

Elders, Job, Vincent Spiering, and Steve Walsh, *Microsystems Technology (MST) and MEMS Applications: An Overview*, MRS Bulletin, Apr. 2001, pp. 312-315.

Goldman, Ken, K. Sooriakumar, Cindy Ray, and Mark Schade, "Evaluating the use of hardmask films during bulk silicon etching," *MICRO Magazine*, Mar. 1997, p. 67, http://micromagazine.com/archive/97/03/goldman.html.

Kovacs, Gregory T.A., Nadim Maluf, and Kurt E. Petersen, "Bulk Micromachining of Silicon," *Proceedings of the IEEE*, vol. 86, No. 8, 1998, pp. 1536-1551.

Maluf, Nadim, *An Introduction to Microelectromechanical Systems Engineering*, Norwood, MA: Artech House, Inc., 2000, p. 60.

Robbins, H., and B. Schwartz, "Chemical Etching of Silicon: I. The System HF, $HNO_3$, and $H_2O$," *Journal of the Electrochemical Society*, vol. 106, No. 6, Jun. 1959, pp. 505-508.

Robbins, H., and B. Schwartz, "Chemical Etching of Silicon: II. The System HF, $HNO_3$, and $H_2O$, and $HC_2H_3O_2$," *Journal of the Electrochemical Society*, vol. 107, No. 2, Feb. 1960, pp. 108-111.

Yoon, Tae Hwan, Eun Jung Hwang, Dong Yong Shin, Se Ik Park, Seung Jae Oh, Sung Cherl Jung, Hyung Cheul Shin, and Sung June Kim, "A Micromachined Silicon Depth Probe for Multichannel Neural Recording," *IEEE Transactions on Biomedical Engineering*, vol. 47, No. 8, Aug. 2000.

Black C. T. et al., "Integration of Self-Assembled Diblock Copolymers for Semiconductor Capacitor Fabrication," Applied Physics Letters, vol. 79, No. 3, Jul. 16, 2001, 2001 American Institute of Physics, pp. 409-411.

* cited by examiner

*Primary Examiner*—Monique R. Jackson
(74) *Attorney, Agent, or Firm*—Hovey Williams LLP

(57) ABSTRACT

New protective coating layers for use in wet etch processes during the production of semiconductor and MEMS devices are provided. The layers include a primer layer, a first protective layer, and an optional second protective layer. The primer layer preferably comprises an organo silane compound in a solvent system. The first protective layer includes thermoplastic copolymers prepared from styrene, acrylonitrile, and optionally other addition-polymerizable monomers such as (meth)acrylate monomers, vinylbenzyl chloride, and diesters of maleic acid or fumaric acid. The second protective layer comprises a highly halogenated polymer such as a chlorinated polymer which may or may not be crosslinked upon heating.

16 Claims, No Drawings

SPIN-ON PROTECTIVE COATINGS FOR WET-ETCH PROCESSING OF MICROELECTRONIC SUBSTRATES

BACKGROUND OF THE INVENTION

1. Field of the Invention

The present invention is concerned with new protective coatings (primer layer, first protective coating, and optional second protective coating) for use in the manufacture of microelectronic devices such as those used in microelectromechanical systems (MEMS).

2. Description of the Prior Art

Etchants used for deep etching may vary depending upon the etch selectivity requirements for the devices to be fabricated. Basic etchants may contain amines such as ethylene diamine, ethanolamine, and/or water-miscible lower alcohols such as isopropanol to modulate the etching behavior of the solution. Bulk silicon etching is typically performed at temperatures in the range of 40° to 120° C. and most typically at 60° to 90° C. The etching times range from 1 to 24 hours and most typically are in the range of 5 to 15 hours.

Acidic etchants include aqueous solutions of hydrofluoric acid (HF), including concentrated (49% to 50%) HF, aqueous dilutions of the same, and buffered oxide etchants comprising aqueous mixtures of HF and ammonium fluoride. HF etchants are used primarily for etching silicon dioxide. Mixed acid etchants typically comprise mixtures of 70% nitric acid ($HNO_3$), 49% HF, and a diluent acid (e.g., 85% phosphoric acid ($H_3PO_4$) or 100% acetic acid) and are used primarily for bulk silicon etching. Common component ratios by volume for the mixtures are, for example, $HNO_3/HF/H_3PO_4$=7:1:7 or 3:1:4.

Etching times for bulk silicon in these acid mixtures are typically in the range of 5 to 30 minutes and in some cases as long as 120 minutes at room temperature.

It is common in silicon etching processes to utilize a thin (100- to 300-nm) silicon nitride or silicon dioxide coating on the silicon substrate as a mask for patterned etching or as a passivating layer to enclose active circuitry. Therefore, the protective coating system described here is commonly applied onto $Si_3N_4$ or $SiO_2$, which means good adhesion to these substrates is critical for obtaining acceptable protection.

In the prior art, etch protective coatings or masks for MEMS fabrication processes have been selected primarily by using a trial-and-error method because there are no general-purpose protective coatings on the market. The etch selectivity of the etchants to various materials is often used as a guide for MEMS process engineers. With a much lower etch rate than silicon, films of silicon nitride have been used as a protective layer or hardmask during KOH or TMAH bulk silicon etching. Silicon dioxide has a higher etch rate than silicon nitride. Therefore, it is only used as a protective/mask layer for very short etches. Gold (Au), chromium (Cr), and boron (B) have also been reportedly used in some situations. Non-patterned hard-baked photoresists have been used as masks, but they are readily etched in alkaline solutions. Polymethyl methacrylate was also evaluated as an etch mask for KOH. However, because of saponification of the ester group, the masking time of this polymer was found to decrease sharply from 165 minutes at 60° C. to 15 minutes at 90° C. Black wax (Apiezon® W, available from Scientific Instrument Services, Inc., New Jersey) was also used as a protective coating in a 30% by weight KOH etch process (70° C.). After wet etching, the wax was removed using trichloroethylene.

Organic polymers are ideal candidates for protective coatings. The IC and MEMS industries have been using polymeric coating materials as photoresists, anti-reflective coatings, and planarization layers for many years. These materials are conveniently applied as thin films by the spin-on method and then baked or UV-cured to achieve the final coating form. One important requirement for the polymer is that it be highly soluble at room temperature in an environmentally friendly solvent. Because of the lack of a proper solvent, semicrystalline polyolefins such as polypropylene and polyethylene, as well as semicrystalline fluoropolymers such as Teflon®, which are known to have excellent corrosion resistance to strong acids and strong bases, cannot be formulated into spin-coated compositions for protective coating applications. At the same time, many common thermoplastic polymers such as polystyrene, poly (cyclic olefins), polymethyl methacrylate, polydimethylsiloxanes, polyimides, polysulfones, and various photoresist polymers (e.g., polyhydroxystyrene and novolac resins) fail to survive many common, harsh deep-etching processes because of their susceptibility and permeability to the etchants, poor adhesion to the substrate, tendency to form coating defects, or lack of solubility in solvents accepted in the microelectronics industry.

SUMMARY OF THE INVENTION

The present invention overcomes these problems by providing spin-applied, polymer coating systems which protect device features from corrosion and other forms of attack during deep-etching processes which utilize concentrated aqueous acids and bases. Furthermore, these coating systems can be easily removed at the end of the processes.

In more detail, these systems comprise a first protective layer which is applied to a microelectronic substrate surface. The first protective layer is formed from a composition which comprises a polymer dispersed or dissolved in a solvent system. Preferred polymers are thermoplastic polymers and comprise recurring monomers having the formula

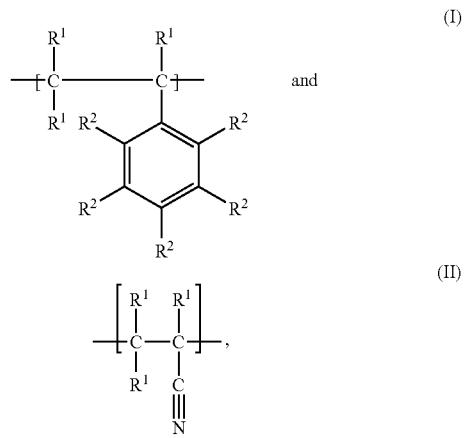

wherein:
each $R^1$ is individually selected from the group consisting of hydrogen and $C_1$-$C_8$ (and preferably $C_1$-$C_4$) alkyls; and
each $R^2$ is individually selected from the group consisting of hydrogen, $C_1$-$C_8$ (and preferably $C_1$-$C_4$) alkyls, and $C_1$-$C_8$ (and preferably $C_1$-$C_4$) alkoxys.

The polymer preferably comprises at least about 50% by weight of monomer (I), more preferably from about 50-80% by weight of monomer (I), and even more preferably from about 65-78% by weight of monomer (I), based upon the total weight of the polymer taken as 100% by weight. The polymer preferably comprises at least about 15% by weight of monomer (II), more preferably from about 15-40% by weight of monomer (II), and even more preferably from about 20-35% by weight of monomer (II), based upon the total weight of the polymer taken as 100% by weight.

Monomers other than monomers (I) and (II) can also be present in the polymer, if desired. When other monomers are present, the combined weight of monomers (I) and (II) in the polymer is preferably at least about 60% by weight, and more preferably from about 60-99% by weight, based upon the total weight of the polymer taken as 100% by weight. Examples of suitable other monomers include those having functional groups which can react with groups in a primer layer (e.g., an organo silane primer layer as discussed herein) are desirable for achieving chemical bonding between the two layers, thereby reducing the likelihood of lifting of the first coating layer during the etching process. These monomers may have, by way of example, haloalkyl d.g., benzyl chloride, 2-chloroethyl methacrylate), ester (methacrylates, acrylates, maleates, fumarates), epoxy, or anhydride functional groups, which react readily with functional groups such as hydroxyl, amino, or oxiranyl groups which can be present in the primer-layer. Some exemplary co-monomers are represented by the formulas

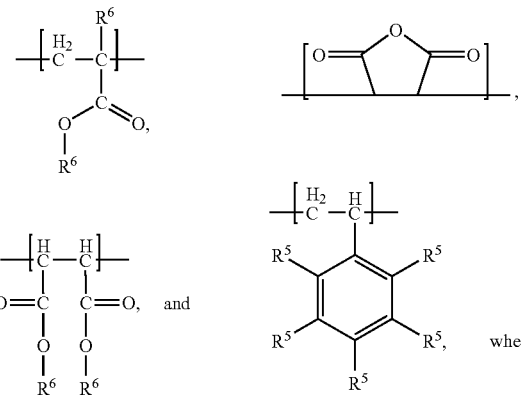

each $R^5$ is individually selected from the group consisting of hydrogen and haloalkyls (preferably $C_1$-$C_4$), with at least one $R^5$ preferably being a haloalkyl;

each $R^6$ is individually selected from the group consisting of hydrogen, $C_1$-$C_{10}$ alkyls (e.g., methyl, ethyl, butyl, isobornyl), haloalkyls (preferably $C_1$-$C_4$, e.g., 2-chloroethyl)), and epoxy-containing groups (preferably $C_1$-$C_4$, e.g., glycidyl groups);

In the instance of functional groups derived from carboxylic acids such as esters or anhydrides, it is important that the corresponding monomer concentration in the thermoplastic copolymer be less than about 20% by weight, and preferably less than about 10% by weight to limit the possibility of hydrolysis and consequent dissolution or swelling of the first coating layer by basic etchants. Alternatively, the copolymer may be alloyed with other compatible polymers (e.g., polymethyl methacrylate, polyethyl methacrylate, poly(6-caprolactone), and polyvinyl chloride) that enhance coating adhesion to the primer layer via chemical or physical bonding, or that reduce permeability and chemical susceptibility to basic etchants.

The polymer should be included in the first protective layer composition at a level of from about 5-30% by weight, preferably from about 10-25% by weight, and even more preferably from about 15-22% by weight, based upon the total weight of the first protective layer composition taken as 100% by weight.

The solvent system utilized in protective layer composition should have a boiling point of from about 100-220° C., and preferably from about 140-180° C. The solvent system should be utilized at a level of from about 70-95% by weight, preferably from about 75-90% by weight, and more preferably from about 72-85% by weight, based upon the total weight of the first protective layer composition taken as 100% by weight. Preferred solvent systems include a solvent selected from the group consisting of methyl isoamyl ketone, di(ethylene glycol) dimethyl ether, propylene glycol monomethyl ether acetate, ethyl lactate, cyclohexanone, and mixtures thereof.

While the first protective layer composition can be a cross-linkable composition, it is preferably a non-crosslinkable composition. Furthermore, it is preferred that the first protective layer formed from the first protective layer composition be nonconductive. The final first protective layer should also be non-photosensitive (i.e., a pattern cannot be defined in the layer when it is exposed to about 1 J/cm$^2$) and non-alkaline soluble (i.e., it is substantially—less than 0.5% by weight—insoluble in an aqueous solution having a pH of greater than about 8, and preferably greater than about 10).

There is preferably also a primer layer utilized in the protective systems of the invention. This layer should be included between the substrate and the first protective layer. Preferred primer layers are formed from primer layer compositions including a silane dispersed or dissolved in a solvent system. Aromatic and organo silanes are particularly preferred silanes for use in the primer layers of the invention. The most preferred silanes have the formula

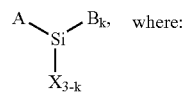 where:

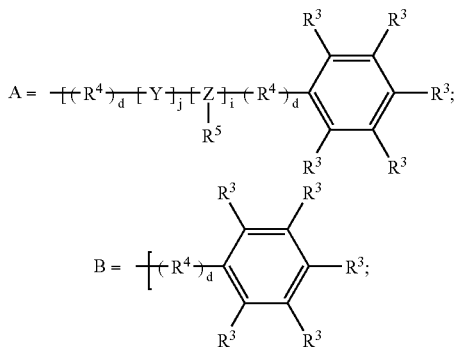

each of i, j, and k is individually selected from the group consisting of 0 and 1, and if one of i and j is 1, then the other of i and j is 0;

each $R^3$ is individually selected from the group consisting of hydrogen, the halogens, $C_1$-$C_8$ (preferably $C_1$-$C_4$) alkyls, $C_1$-$C_8$ (preferably $C_1$-$C_4$) alkoxys, $C_1$-$C_8$ (preferably $C_1$-$C_4$) haloalkyls, aminos, and $C_1$-$C_8$ (preferably $C_1$-$C_4$) alkylaminos;

each $R^4$ is individually selected from the group consisting of $C_1$-$C_8$ (preferably $C_1$-$C_4$) aliphatic groups;

each X is individually selected from the group consisting of halogens, hydroxyls, $C_1$-$C_4$ alkoxys and $C_1$-$C_4$ carboxyls;

Y is selected from the group consisting of oxygen and sulfur;

Z is selected from the group consisting of nitrogen and phosphorus; and each d is individually selected from the group consisting of 0 and 1.

Particularly preferred silanes include phenylsilanes such as phenyltrimethoxysilane, phenyltrichlorosilane, phenyltriethoxysilane, phenyltriacetoxysilane, and diphenylsilanes such as diphenyldimethoxysilane, diphenyldichlorosilane, and diphenylsilanediol. The most preferred silanes include 2-phenylethyltrialkoxysilane, p/m-chlorophenyltrimethoxysilane, p/m-bromophenyltrimethoxysilane,(p/m-chloromethyl)phenyltrimethoxysilane, 2-(p/m-methoxy)phenylethyltrimethoxysilane, 2-(p/m-chloromethyl)phenylethyltrimethoxysilane, 3,4-dichlorophenyltrichlorosilane, 3-phenoxypropyltrichlorosilane, 3-(N-phenylamino)propyltrimethoxysilane, and 2-(diphenylphosphino)ethyltriethoxysilane.

An effective primer layer composition according to the invention is a mixture of diphenyldialkoxysilane (e.g., diphenyldimethoxysilane) and phenyltrialkoxysilane, (e.g., phenyltrimethoxysilane) or, even more preferably, a mixture of diphenylsilanediol and phenyltrimethoxysilane in a solution of 1-methoxy-2-propanol or 1-propoxy-2-propanol with from about 5-10% by weight water. A particularly effective primer layer composition for first protective layers comprising a poly(styrene-co-acrylonitrile) polymer is an alcohol and water solution containing from about 0.1-1.0% (preferably from about 0.25-0.5%) by weight diphenylsilanediol and from about 0.1-1.0% (preferably from about 0.25-0.5%) by weight of phenyltrimethoxysilane. Upon heating, diphenylsilanediol and phenylsilanetriol (the hydrolysis product of phenyltrimethoxysilane) condense to form siloxane bonds and establish a three-dimensional silicone coating layer on the substrate.

Another preferred silane has the formula

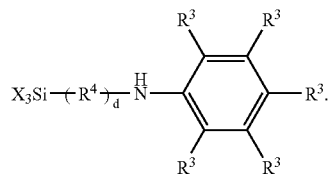

(III)

Silanes having this structure are not only compatible with styrene-containing copolymers, but they are also reactive with ester, benzyl chloride, and/or epoxy groups that may be present in the first protective layer, and they are excellent adhesion promoters. One particularly preferred silane within the scope of this formula is

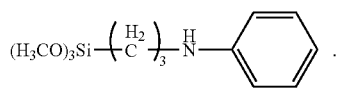

This silane is 3-[N-phenylamino]propyltrimethoxysilane, and it is commercially available from Lancaster Synthesis and Gelest Corporation.

The silane should be included in the primer layer composition at a level of from about 0.01-5% by weight, preferably from about 0.1-1% by weight, and even more preferably from about 0.2-0.8% by weight, based upon the total weight of the primer layer composition taken as 100% by weight.

The solvent system utilized in the primer layer composition should have a boiling point of from about 100-220° C., and preferably from about 140-180° C. The solvent system should be utilized at a level of from about 80-99.9% by weight, and preferably from about 85-99% by weight, based upon the total weight of the primer layer composition taken as 100% by weight. Preferred solvent systems include a solvent selected from the group consisting of methanol, ethanol, isopropanol, butanol, 1-methoxy-2-propanol, ethylene glycol monomethyl ether, and 1-propoxy-2-propanol, and mixtures thereof. In one preferred embodiment, water is included in the solvent system at a level of from about 2-15% by weight, and preferably from about 5-10% by weight, based upon the total weight of the primer layer composition taken as 100% by weight.

The primer layer composition can optionally include low levels (e.g., from about 0.01-0.10% by weight) of a catalyst. Suitable catalysts include any inorganic or organic acid (e.g., hydrochloric acid, sulfuric acid, phosphoric acid, acetic acid) or an inorganic or organic base (e.g., potassium hydroxide, TMAH, ammonia, amines).

In a preferred embodiment, the protective system of the invention further includes a second protective layer on top of the first protective layer to provide further protection against concentrated aqueous acids such as hydrofluoric acid, nitric acid, phosphoric acid, acetic acid, and mixtures of the foregoing. This embodiment is useful in situations where a acid etching is utilized. Preferred second protective layers are formed from second protective layer compositions comprising a linear, slightly branched, or cyclic halogenated polymer dissolved or dispersed in a solvent system. Furthermore, these halogenated polymers should comprise high levels of halogen atoms (at least about 50% by weight halogen atoms, and preferably at least about 60% by weight halogen atoms). The most preferred halogenated polymers are chlorinated polymers such as those comprising recurring monomers having the formula

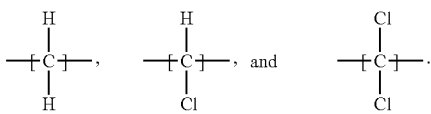

Specific examples of preferred halogenated polymers include those selected from the group consisting of poly(vinyl chloride), polyvinylidene chloride, poly(vinylidene dichloride)-co-poly(vinyl chloride), chlorinated ethylene, chlorinated propylene, and mixtures thereof. Halogenated chlorinated rubber is also very effective.

The halogenated polymer should be included in the second protective layer composition at a level of from about 8-30% by weight, and preferably from about 10-20% by weight, based upon the total weight of the second protective layer composition taken as 100% by weight. The solvent system utilized in the second protective layer composition should have a boiling point of from about 100-220° C., and preferably from about 140-180° C. The solvent system should be utilized at a level of from about 70-92% by weight, and preferably from about 80-90% by weight, based upon the total weight of the second protective layer composition taken as 100% by weight.

DETAILED DESCRIPTION OF THE PREFERRED EMBODIMENTS

Examples

The following examples set forth preferred methods in accordance with the invention. It is to be understood, however, that these examples are provided by way of illustration and nothing therein should be taken as a limitation upon the overall scope of the invention.

Typical Application Process

Prior to applying the primer layer, it is preferable to prepare the substrate by exposing it to brief (from about 15-60 seconds) oxygen plasma etching to clean and/or chemically activate the substrate surface to improve bonding by the primer layer. Plasma bombardment with heavy ions such as argon can also be beneficial for improving bonding. Such processes are especially effective for improving the bonding of the protective coating system to silicon nitride.

Preferred substrates for use in this process include those selected from the group consisting of Si substrates, $SiO_2$ substrates, $Si_3N_4$ substrates, $SiO_2$ on silicon substrates, $Si_3N_4$ on silicon substrates, glass substrates, quartz substrates, ceramic substrates, semiconductor substrates, and metal substrates.

The organosilane solution that makes up the primer layer is spin-applied onto the substrate at about 500-5000 rpm, and preferably from about 1000-2000 rpm, for about 30-90 seconds. It is then baked at greater than about 100° C. for about 60-90 seconds to condense the organosilane molecules into a continuous film that is bonded to surface hydroxyl groups present on many microelectronic substrates. It is preferred that the primer layer have an average thickness (as measured by an ellipsometer over 5 different points) of less than about 5 nm and more preferably from about 2-8 nm.

For the first protective layer, the thermoplastic polymer is dissolved in a suitable solvent at a concentration of from about 5-25% by weight and spin coated onto the substrate at about 500-5000 rpm, and preferably from about 1000-3000 rpm, for about 30-90 seconds. It is soft-baked at a temperature of from about 80-130° C. for about 60-120 seconds to dry the coating and then is subjected to a final bake at a temperature of from about 130-225° C. for about 60-90 seconds to densify the first protective layer and bond it firmly to the primer layer. The preferred process for baking styrene-acrylonitrile coatings is to bake them at a temperature of about 130° C. for about 120 seconds and then at a temperature of about 200° C. for about 60 seconds. The polymer solids level and spinning conditions are adjusted typically to achieve a final coating thickness of from about 1-5 µm, and preferably from about 2-5 µm, depending upon the degree of coverage required over device topography on the substrate.

The second protective layer is applied from a solvent solution in a manner similar to that described above with respect to the first protective layer. The solvents used to apply the second protective layer should be selected to minimize detrimental interaction with the first protective layer. It is preferred that the second protective layer have an average thickness (as measured by an ellipsometer over 5 different points) of from about 1-5 µm, and more preferably from about 2-5 µm.

It is preferred that the protective layer(s) or coating(s) be removed after the wet etching processes have been completed. A particularly preferred technique is stripping the coating(s) with solvents commonly used in microelectronic processing such as acetone, propylene glycol methyl ether acetate, or ethyl lactate. In this technique, the coated substrate is sprayed with, or immersed in, the solvent until the coating layer has fully dissolved. The substrate is then rinsed with fresh solvent until clean. The protective coating system described here is easily removed by dissolving the thermoplastic layer (the first coating layer) in a solvent such as acetone. The second coating layer, if present, is either dissolved at the same time or is lifted as the first layer dissolves.

Practicing the present invention will result in a protective layer system which suffers little or no lifting during etching processes. That is, the layer systems will exhibit less than about 3 mm, preferably less than about 2 mm, and more preferably less than about 1 mm of lifting when subjected for about 2 hours to etching in an approximately 30-35% by weight aqueous KOH solution having a temperature of about 83-87° C. Lifting is determined by measuring from the outside edge of the substrate to the furthest point on the layer system where the layer system is still attached to the substrate.

Furthermore, the inventive protective layer system will experience very little or no etchant penetration during etching processes. Thus, when subjected for about 2 hours to etching in an approximately 30-35% by weight aqueous KOH solution having a temperature of about 83-87° C., the inventive protective systems will have less than about 0.1 pinholes per $cm^2$ of substrate, and preferably less than about 0.05 pinholes per $cm^2$ of substrate, when observed under a microscope at 10× magnification.

Example 1

Preparation of Primers I-IV

Primer I was prepared by dissolving 0.5 g of diphenyldichlorosilane in 99.5 g of xylene followed by filtering with a 0.2/0.45-µm polypropylene filter.

Primer II was prepared by dissolving 0.5 g of diphenyldimethoxysilane in 90 g of isopropanol and 10 g of water followed by filtering with a 0.2/0.45-µm polypropylene filter.

Primer III was prepared by dissolving 0.5 g of diphenylsilanediol and 0.5 g of phenyltrimethoxysilane in 90 g of propylene glycol monomethyl ether (PGME) and 10 g of water. The primer was aged for at least 24 hours so that the silanes were partially hydrolyzed and condensed. The primer was then it was filtered using a 0.2/0.45-µm polypropylene filter.

Primer IV was prepared by dissolving 1.0 g of diphenylsilanediol and 1.0 g of phenyltrimethoxysilane in 88 g of PGME and 10 g of water. The primer was similarly aged and then filtered using a 0.2/0.45-µm polypropylene filter.

Example 2

Preparation of Primer V (Comparative Primer)

In a manner similar to Example 1, Primer V was prepared by adding 1.0 g of 3-aminopropyltriethoxysilane into 95 g of PGME and 5 g of water. The primer was aged for at least 24 hours so that the silane was partially hydrolyzed and condensed. The primer was then filtered using a 0.2/0.45-µm polypropylene filter.

Example 3

Preparation of Primer VI

A diethyl fumarate-modified, amino functional silane was prepared by mixing one mole of N-(3-trimethoxysilyl)-propylethylenediamine with one mole of diethyl fumarate, followed by stirring at room temperature for 48 hours. The mixing process was exothermic, indicating the immediate reaction of the two components.

Primer VI was prepared by dissolving 1 g of the above modified silane into 90 g of PGME and 10 g of water. The mixture was aged for 24 to 48 hours at room temperature and then filtered using a 0.2/0.45-µm polypropylene filter for future use.

Example 4

Preparation of Primer VII

Primer VII is an adhesion promoter based on 3-(N-phenyl)aminopropyltrimethoxysilane, which is very effective for polystyrene-co-acrylonitrile polymers, especially for coatings containing reactive groups such epoxy, ester, or chloromethyl (benzyl chloride) groups. Primer VII was prepared by dissolving 0.5 g of the aromatic amino silane in 90 g of PGME and 10 g of water. The mixture was aged in a manner similar to the previous examples and filtered using a 0.2/0.45-μm polypropylene filter.

Example 5

Preparation of Coating Compositions A and B from a Copolymer of Styrene and Acrylonitrile Commercially available styrene-acrylonitrile resins were used directly for coating formulations. Composition A was formulated by dissolving 12 g of poly(styrene-co-acrylonitrile) (SAN30: $M_w$=185,000, 30 wt % acrylonitrile, available from Aldrich) in 44 g of methyl isoamyl ketone (MIAK) and 44 g of di(ethylene glycol) dimethyl ether. Composition B was formulated by dissolving 18 g of SAN30 in 41 g of methyl isoamyl ketone (MIAK) and 41 g of di(ethylene glycol) dimethyl ether. Both coating compositions were filtered twice using a 0.2/0.45-μm polypropylene filter. Alternatively, a mixed solvent of propylene glycol monomethyl ether acetate (PGMEA) and ethyl lactate in a weight ratio of 9:1 was also used as the solvent. The change of solvent did not noticeably change the coating quality or adhesion.

Example 6

Preparation of a Terpolymer and Formulation of Coating Composition C from the Terpolymer In this procedure, a terpolymer of styrene, acrylonitrile, and glycidyl methacrylate was prepared. Styrene and glycidyl methacrylate were purified by passing through an aluminum oxide column. Acrylonitrile was purified by washing sequentially with a 5% by weight $H_2SO_4$ solution, a 5% by weight NaOH solution, and water to remove inhibitors and amine impurities that might cause crosslinking of the polymer. It was dried over anhydrous calcium chloride and then 4-Å molecular sieves.

A 500-ml two-neck flask containing a 1-inch magnetic stirring bar was charged with 100 g of cyclohexanone (or PGMEA) and a mixture of purified monomers including 35 g of styrene, 10 g of acrylonitrile, and 5 g of glycidyl methacrylate. Next, 300 mg of 2,2'-azobisisobutylnitrile (AIBN) (or benzoyl peroxide) were added to the mixture as an initiator. The side neck of the flask was capped with a rubber septum, and the main neck of the flask was connected to a water-cooled condenser with the top end of the condenser linked to a bubbler containing mineral oil. After fixing the entire glass assembly to a metal stand, the system was purged with nitrogen to remove oxygen through the side neck of the flask through a needle. The flask was heated using a hotplate at 80° C. for about 8 hours to polymerize the monomer mixture. During the reaction, the reactor was slowly purged with nitrogen to prevent oxygen from entering. The polymer obtained was then precipitated in a mixture of isopropanol or ethanol containing 20% by weight water in a fast-stirring blender. The polymer was recovered by filtration and vacuum-dried to remove any solvent or monomer residues. The yield or conversion of the reaction was 80% to 85%. Gel permeation chromatography (GPC) indicated the weight average molecular weight of the polymer was about 200,000 g/mole (relative to polystyrene standard).

Composition C (12.5% solids) was prepared by dissolving 12.5 g of the recovered dry polymers in 94.5 g of PGMEA and 10.5 g of ethyl lactate. It was filtered twice using 0.2/0.45-μm polypropylene filters.

Example 7

Preparation of a Terpolymer and Formulation of a Coating Composition D from the Terpolymer A terpolymer of styrene, acrylonitrile, and butyl acrylate was prepared in this example. The styrene and acrylonitrile were purified according to the same method described in Example 6. Butyl acrylate was purified by passing through a column of aluminum oxide.

A mixture of purified monomers including 30 g of styrene, 15 g of acrylonitrile, and 5 g of butyl acrylate was polymerized in PGMEA, and the polymer was recovered using the same method described in Example 3. The conversion or the yield of the polymerization for this system was around 80%. GPC molecular weight ($M_w$) for this polymer was around 99,600 g/mole (relative to polystyrene standard).

Composition D (15% solids) was prepared by dissolving 15 g of the recovered dry polymer in 76.5 g of PGMEA and 8.5 g of ethyl lactate. It was filtered twice using a 0.2/0.45-μm polypropylene filter.

Example 8

Preparation of a Quaterpolymer and Formulation of a Coating Composition E from the Polymer In this procedure, a quaterpolymer of styrene, acrylonitrile, butyl acrylate, and glycidyl methacrylate was prepared. To accomplish this, styrene, butyl acrylate, and glycidyl methacrylate were purified by passing through a column of aluminum oxide. Acrylonitrile was purified by washing with 5 wt % $H_2SO_4$, 5 wt % NaOH, and deionized water sequentially followed then dried over anhydrous calcium chloride and 4 Å molecular sieves.

A mixture of purified monomers including 25 g of styrene, 15 g of acrylonitrile, 5 g of butyl acrylate, and 5 g of glycidyl methacrylate was polymerized and recovered according to the methods described in Example 6. The conversion or the yield of the polymerization for this system was around 80%. GPC molecular weight (Mw) for this polymer was around 124,600 g/mole (relative to polystyrene standard).

Composition E (15 wt % solids) was prepared by dissolving 15 g of the recovered dry polymers in 76.5 g of PGMEA and 8.5 g of ethyl lactate. It was filtered twice using a 0.2/0.45-μm polypropylene filter.

Example 9

Preparation of Coating Composition F

Composition F was prepared by combining in solution 13.5 g of a copolymer of styrene and acrylonitrile ($M_w$=165,000, 25% acrylonitrile) and 1.5 g of polymethyl methacrylate (PMMA, $M_w$=120,000). The coating composition was filtered using a 0.2/0.45-μm polypropylene filter.

Example 10

Preparation of Coating Composition G

Composition G was prepared by dissolving 12 g of chlorinated rubber (CLORTEX® 20 from American Tartaric Corporation) in 88 g of PGMEA, followed by filtering with a 0.2/0.45-μm polypropylene filter.

Example 11

Preparation of Coating Composition H

Composition H was prepared by dissolving 10 g of chlorinated PVC (TempRite 674X571 from Noven, Inc.) in 90 g of cyclohexanone, followed by filtering with a 0.2/0.45-μm polypropylene filter.

Example 12

Procedure for Applying Primers I-VII and Coating Compositions A-G

A silicon, silicon nitride, or silicon nitride wafer with aluminum deposited at the central area was mounted on a spin-coater and centered properly. Under conditions of a spin acceleration rate of 20,000 rpm$^2$, a spin speed of 2,500 rpm, and a duration of 90 seconds, the wafer was first washed with acetone for about 20 seconds to remove any possible contaminants, and then an aliquot of 5 to 10 ml of the primer was dispensed onto the wafer. After spinning for about another 40 to 60 seconds, a uniform primer layer was obtained on top of the wafer. Subsequently, the primed wafer was baked on a hotplate at 100-130° C. for 1 minute to promote chemical bonding between the substrate and the primer as well as partial vulcanization of the primer. After the primed wafer cooled to room temperature, a layer of the particular coating composition (e.g., Composition A) was spin-applied and then baked on a hotplate sequentially at 100° C. for 2 minutes, 130° C. for 1 minute, and 205° C. for 1 minute.

Example 13

KOH Deep-Etch Tests for Various Coating/Primer Combinations

The test equipment included a glass etchant tanker containing about 4000 ml of a 30% to 35% by weight aqueous KOH solution in which a TEFLON® wafer boat holding the test substrates in a horizontal orientation was fully immersed. The etchant solution was heated using an internal heating unit or outer heating unit such as a hotplate, and the temperature of the etchant was controlled to 85° C.±1.5° C. In general, 4-inch wafers of silicon, silicon nitride, or silicon nitride with aluminum deposited at the central circular area (approximately 2 inches in diameter) were used for the test. For silicon wafers, the test was only conducted for 2 to 4 hours because of the high etch rate of silicon in KOH. For silicon nitride wafers, the test was extended to at least 8 hours. During the etch test, the solution was bubbled vigorously with nitrogen to provide agitation. After the etching period, wafer samples were removed, rinsed, dried, and then inspected for pinholes and edge lift or detachment of the coating layer(s).

Because aluminum is very reactive toward KOH solution, any penetration of the coating (either by pinholes or poor KOH resistance of the coating) was indicated by disappearance of aluminum at the area. The distance from the edge of the wafer to the front line of coating detachment in the radial direction was used as a measure of the adhesion quality of the primer/coating combination. Results are shown in Table 1.

TABLE 1

KOH deep-etch test results for various coating/primer combinations.

| Exp # | Substrate | O$_2$ Plasma Etch | Primer | Coating Composition | Protective Coating Bake Process | Results MM of Lifting | Comments |
|---|---|---|---|---|---|---|---|
| 1 | Nitride | None | None | A | 100° C./120 sec<br>130° C./120 sec<br>205° C./60 sec | 4-30 mm | Control |
| 2 | Nitride + Al pad | None | None | A | 100° C./120 sec<br>130° C./120 sec<br>205° C./60 sec | 4-25 mm | Control |
| 3 | Silicon | None | None | A | 100° C./120 sec<br>130° C./120 sec<br>205° C./60 sec | Completely lifted | Control |
| 4 | Nitride | Yes | III | A | 100° C./120 sec<br>130° C./120 sec<br>205° C./60 sec | 2-3 mm | |
| 5 | Nitride + Al pad | Yes | III | A | 100° C./120 sec<br>130° C./120 sec<br>205° C./60 sec | 1-3 mm | |
| 6 | Silicon | None | III | A | 100° C./120 sec<br>130° C./120 sec<br>205° C./60 sec | 5-30 mm | Edge lift not uniform |
| 7 | Nitride | Yes | III | B | 100° C./120 sec<br>130° C./120 sec<br>205° C./60 sec | 1-3 mm | |
| 8 | Nitride + Al pad | Yes | III | B | 100° C./120 sec<br>130° C./120 sec<br>205° C./60 sec | 1-3 mm | |
| 9 | Silicon | None | III | B | 100° C./120 sec<br>130° C./120 sec<br>205° C./60 sec | 3-25 mm | Edge lift not uniform |

TABLE 1-continued

KOH deep-etch test results for various coating/primer combinations.

| Exp # | Substrate | O₂ Plasma Etch | Primer | Coating Composition | Protective Coating Bake Process | Results MM of Lifting | Comments |
|---|---|---|---|---|---|---|---|
| 10 | Nitride | Yes | IV | B | 100° C./120 sec<br>130° C./120 sec<br>205° C./60 sec | 1-2 mm | |
| 11 | Nitride + Al pad | Yes | IV | B | 100° C./120 sec<br>130° C./120 sec<br>205° C./60 sec | 1-3 mm | |
| 12 | Silicon | None | IV | B | 100° C./120 sec<br>130° C./120 sec<br>205° C./60 sec | 10-40 mm | Edge lift not uniform |
| 13 | Nitride | Yes | IV | B | 100° C./120 sec<br>130° C./120 sec<br>205° C./60 sec | 1-3 mm | |
| 14 | Nitride + Al pad | Yes | IV | B | 100° C./120 sec<br>130° C./120 sec<br>205° C./60 sec | 2-3 mm | |
| 15 | Silicon | None | IV | B | 100° C./120 sec<br>130° C./120 sec<br>205° C./60 sec | 8-26 mm | Edge lift not uniform |
| 16 | Nitride | Yes | V | A | 100° C./120 sec<br>130° C./120 sec<br>250° C./60 sec | 1-5 mm | Edge lift not uniform |
| 17 | Nitride | Yes | V | A | 100° C./120 sec<br>130° C./120 sec<br>250° C./60 sec | 3-7 mm | Edge lift not uniform |
| 18 | Nitride | None | VII | B | 100° C./60 sec<br>205° C./60 sec | 0 | |
| 19 | Nitride + Al pad | None | VII | B | 100° C./60 sec<br>205° C./60 sec | 2-4 mm | |
| 20 | Silicon | None | VII | B | 100° C./60 sec<br>205° C./60 sec | 0 | |
| 21 | Nitride | None | VI | C | 100° C./60 sec<br>205° C./60 sec | 4-6 mm | |
| 22 | Nitride | None | VI | C | 100° C./60 sec<br>205° C./60 sec | 3-4 mm | |
| 23 | Nitride | None | VII | C | 100° C./60 sec<br>205° C./60 sec | 0 | |
| 24 | Nitride + Al pad | None | VII | C | 100° C./60 sec<br>205° C./60 sec | 0 | |
| 25 | Silicon | None | VII | C | 100° C./60 sec<br>205° C./60 sec | 0 | |
| 26 | Nitride | None | VII | D | 100° C./60 sec<br>205° C./60 sec | 1-2 mm | |
| 27 | Nitride + Al pad | None | VII | D | 100° C./60 sec<br>205° C./60 sec | 1-2 mm | |
| 28 | Silicon | None | VII | D | 100° C./60 sec<br>205° C./60 sec | 0 | |
| 29 | Nitride | None | VII | E | 100° C./60 sec<br>205° C./60 sec | 0 | |
| 30 | Nitride + Al pad | None | VII | E | 100° C./60 sec<br>205° C./60 sec | 1 mm | |
| 31 | Silicon | None | VII | E | 100° C./60 sec<br>205° C./60 sec | 0 | |
| 32 | Nitride | None | VII | F | 100° C./60 sec<br>205° C./60 sec | 1-3 mm | |
| 33 | Nitride + Al pad | None | VII | F | 100° C./60 sec<br>205° C./60 sec | 1-2 mm | |
| 34 | Silicon | None | VII | F | 100° C./60 sec<br>205° C./60 sec | 1-2 mm | |

Example 14

Resistance of Coating Combinations to Concentrated Hydrofluoric Acid

The test described in this example provided a means for rating the resistance of coating combinations to hydrofluoric acid and the time for the hydrofluoric acid to penetrate the 1.5-micron thick coating layers.

At room temperature, a drop (approximately 0.2 ml) of 49% HF was placed in the center of a silicon wafer coated centrally with aluminum and another drop (approximately 0.2 ml) was placed on the area outside of the aluminum deposit. The wafers were then carefully observed for penetration of hydrofluoric acid through the coating, as indicated by the formation of hydrogen bubbles resulting from the aluminum reacting with hydrofluoric acid. When a silicon nitride-coated wafer was used as the test substrate, penetration of the coating by hydrofluoric acid was observed as etching of the gold-colored silicon nitride layer, which then exposed the gray-colored silicon substrate. The results are shown in Table 2.

TABLE 2

Resistance of coating or coating combination to concentrated hydrofluoric acid.

| Exp # | Substrate | Primer | Protective Coating 1 | Bake Process Coating 1 | Protective Coating 2 | Bake Process Coating 2 | Results |
|---|---|---|---|---|---|---|---|
| 1 | Silicon Nitride | None | A | 130° C./60 sec 205° C./5 min | None | N/A | Coating dissolved or destroyed |
| 2 | Silicon Nitride | None | A | 130° C./60 sec 205° C./5 min | G | 130° C./60 sec 205° C./5 min | No penetration observed after 30 minutes, substrate darkened |
| 3 | Silicon Nitride | V | G | 130° C./60 sec 205° C./5 min | None | N/A | No penetration observed after 30 minutes, substrate darkened |
| 4 | Silicon Nitride | I | G | 130° C./60 sec 205° C./5 min | None | N/A | No penetration observed after 30 minutes, substrate darkened |
| 5 | Silicon Nitride | II | G | 130° C./60 sec 205° C./5 min | None | N/A | No penetration observed after 30 minutes, substrate darkened |
| 6 | Silicon Nitride + Al Pad | VI | H | 100° C./120 sec 130° C./120 sec 205° C./60 sec | None | N/A | No penetration observed after 30 minutes. |

Example 15

A Simulated Test for Resistance of Coating Combination to Mixed Acid

This test was conducted in a mechanical batch etching system using a mixture of nitric acid (70% by weight), hydrofluoric acid (49% by weight), and phosphoric acid (85% by weight) ($HNO_3$:$HF$:$H_3PO_4$=3:1:4) as an etchant. The silicon wafers were contained in a wafer carrier boat, which was then placed in the tool for exposure to the etchant. The wafers were tumbled during the entire length of the etching process (approximately 30 minutes). Once removed, the wafers were rinsed and evaluated for coating performance. The test was conducted at room temperature, with a constant fresh supply of etching solution applied to the substrates. Results are shown in Table 3.

TABLE 3

Resistance of primer/coating combination to mixed acid etchants.

| Exp # | Substrate | Primer | Protective Coating 1 | Bake Process Coating 1 | Protective Coating 2 | Bake Process Coating 2 | Results |
|---|---|---|---|---|---|---|---|
| 1 | Silicon | V | G | 130° C./60 sec 205° C./5 min | None | N/A | Materials lifted off substrate |
| 2 | Silicon | V | A | 130° C./60 sec 205° C./5 min | None | N/A | Completely dissolved after 10 minutes exposure |
| 3 | Silicon | None | A | 130° C./60 sec 205° C./5 min | None | N/A | Completely dissolved after 10 minutes exposure |
| 4 | Silicon | V | A | 130° C./60 sec 205° C./5 min | G | 130° C./60 sec 205° C./5 min | Material lifted off of substrate |
| 5 | Silicon | None | A | 130° C./60 sec 205° C./5 min | G | 130° C./60 sec 205° C./5 min | No observable lifting or penetration |
| 6 | Silicon Dioxide | V | G | 130° C./60 sec 205° C./5 min | None | N/A | Material lifted off of substrate |
| 7 | Silicon Dioxide | None | A | 130° C./60 sec 205° C./5 min | G | 130° C./60 sec 205° C./5 min | Material lifted off of substrate |
| 8 | Silicon | None | A | 130° C./60 sec 250° C./5 min | G | 130° C./60 sec 250° C./5 min | Minimal amount of lifting from the edge of the wafer observed after 10 minutes |
| 9 | Silicon | V | G | 130° C./60 sec 250° C./5 min | None | N/A | Random penetration of film causing a bubble effect. |
| 10 | Silicon | II | G | 130° C./60 sec 250° C./5 min | None | N/A | Film completely lifted after 30 minutes of exposure |
| 11 | Silicon | I | G | 130° C./60 sec 250° C./5 min | None | N/A | 100% of film lifted after 5 minutes exposure |
| 12 | Silicon | II | A | 130° C./60 sec 250° C./5 min | G | 130° C./60 sec 250° C./5 min | Excellent coating, no lifting observed even after 30 minutes of exposure |
| 13 | Silicon | I | A | 130° C./60 sec 250° C./5 min | G | 130° C./60 sec 250° C./5 min | Excellent coating, no lifting observed even after 30 minutes of exposure |

We claim:
1. A microelectronic structure comprising:
a microelectronic substrate having a surface;
a primer layer adjacent said substrate surface, said primer layer comprising a silane having the structure

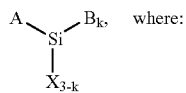

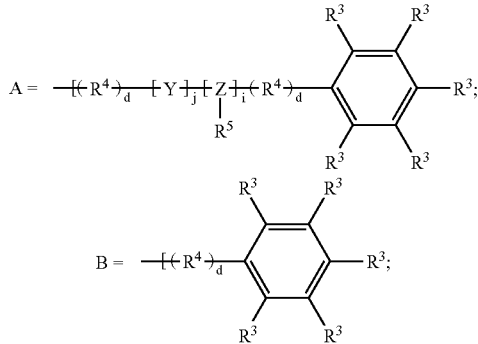

each of i,j, and k is individually selected from the group consisting of 0 and 1, and if one of i and j is 1, then the other of i and j is 0;
each $R^3$ is individually selected from the group consisting of hydrogen, the halogens, $C_1$-$C_8$ alkyls, $C_1$-$C_8$ alkoxys, $C_1$-$C_8$ haloalkyls, aminos, and $C_1$-$C_8$ alkylaminos;
each $R^4$ is individually selected from the group consisting of $C_1$-$C_8$ aliphatic groups;
each X is individually selected from the group consisting of halogens, hydroxyls, $C_1$-$C_4$ alkoxys and $C_1$-$C_4$ carboxyls;
Y is selected from the group consisting of oxygen and sulfur;
Z is selected from the group consisting of nitrogen and phosphorus; and
each d is individually selected from the group consisting of 0 and 1;
a first protective layer adjacent said primer layer, said first protective layer including a polymer comprising recurring monomers having the respective formulas

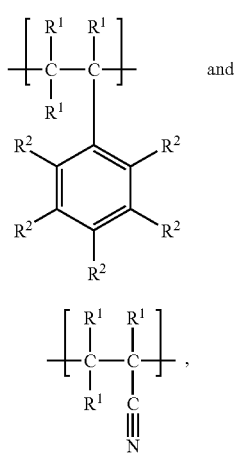

wherein:
each $R^1$ is individually selected from the group consisting of hydrogen and $C_1$-$C_8$ alkyls; and
each $R^2$ is individually selected from the group consisting of hydrogen, $C_1$-$C_8$ alkyls, and $C_1$-$C_8$ alkoxys; and
a second protective layer adjacent said first protective layer, said second protective layer comprising a halogenated polymer.

2. The structure of claim 1, wherein said polymer comprises at least about 50% by weight of monomer I, based upon to total weight of to polymer taken as 100% by weight.

3. The structure of claim 1, wherein said polymer comprises at least about 15% by weight of monomer (II), based upon to total weight of the polymer taken as 100% by weight.

4. The structure of claim 1, said first protective layer having a average thickness of from about 1-5 μm.

5. The structure of claim 1, said primer layer having an average thickness of less than about 10 nm.

6. The structure of claim 1, said halogenated polymer comprising at least about 50% by weight halogen atoms, based upon the total weight of the halogenated polymer taken as 100% by weight.

7. The structure of claim 1, wherein said halogenated polymer is a chlorinated polymer comprising recurring monomers having the formula

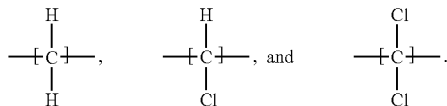

8. The structure of claim 1, wherein said halogenated polymer is a chlorinated polymer selected from the group consisting of poly(vinyl chloride), polyvinylidene chloride, poly(vinylidene dichloride)-co-poly(vinyl chloride), chlorinated ethylene, chlorinated propylene, chlorinated rubbers, and mixtures thereof.

9. The structure of claim 1, wherein said microelectronic substrate is selected from the group consisting of Si substrates, $SiO_2$ substrates, $Si_3N_4$ substrates, $SiO_2$ on silicon substrates, $Si_3N_4$ on silicon substrates, glass substrates, quartz substrates, ceramic substrates, semiconductor substrates, and metal substrates.

10. The structure of claim 1, said second protective layer having an average thickness of from about 1-5 μm.

11. A microelectronic structure comprising:
a microelectronic substrate having a surface, said microelectronic substrate being selected from the group consisting of Si substrates, $SiO_2$ substrates, $Si_3N_4$ substrates, $SiO_2$ on silicon substrates, $Si_3N_4$ on silicon substrates, quartz substrates, ceramic substrates, and semiconductor substrates;
a primer layer adjacent said substrate surface;
a first protective layer adjacent said primer layer, said first protective layer including a polymer comprising recurring monomers having the respective formulas

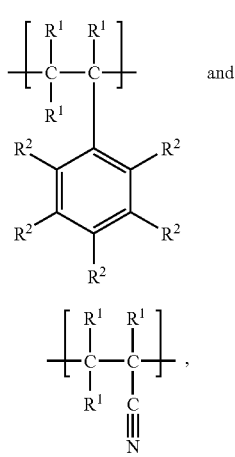

(I) and (II)

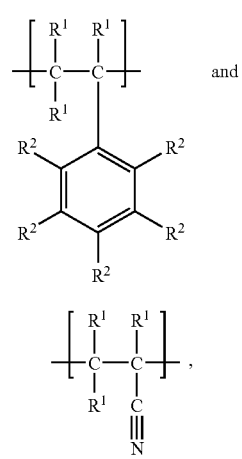

(I) and (II)

wherein:
each $R^1$ is individually selected from the group consisting of hydrogen and $C_1$-$C_8$ alkyls; and
each $R^2$ is individually selected from the group consisting of hydrogen, $C_1$-$C_8$ alkyls, and $C_1$-$C_8$ alkoxys; and
a second protective layer adjacent said first protective layer, said second protective layer comprising a halogenated polymer.

12. The structure of claim 11, said first protective layering having an average thickness of from about 1-5 μm.

13. The structure of claim 11, said second protective layer having an average thickness of from about 1-5 μm.

14. A microelectronic structure comprising:
a microelectronic substrate having a surface;
a primer layer adjacent said substrate surface;
a first protective layer adjacent said primer layer, said first protective layer including a polymer comprising recurring monomers having the respective formulas wherein:
each $R^1$ is individually selected from the group consisting of hydrogen and $C_1$-$C_8$ alkyls; and
each $R^2$ is individually selected from the group consisting of hydrogen, $C_1$-$C_8$ alkyls, and $C_1$-$C_8$ alkoxys
wherein said polymer comprises from about 20-35% by weight of structure (II),
based upon the total weight of the polymer taken as 100% by weight; and
a second protective layer adjacent said first protective layer, said second protective layer comprising a halogenated polymer.

15. The structure of claim 14, said first protective layering having an average thickness of from about 1-5 μm.

16. The structure of claim 14, said second protective layer having an average thickness of from about 1-5 μm.

* * * * *